United States Patent [19]
Tachibana

[11] Patent Number: 5,889,323
[45] Date of Patent: Mar. 30, 1999

[54] SEMICONDUCTOR PACKAGE AND METHOD OF MANUFACTURING THE SAME

[75] Inventor: Hirofumi Tachibana, Tokyo, Japan

[73] Assignee: NEC Corporation, Tokyo, Japan

[21] Appl. No.: 912,788

[22] Filed: Aug. 18, 1997

[30] Foreign Application Priority Data

Aug. 19, 1996 [JP] Japan ................................. 8-217306

[51] Int. Cl.⁶ .......................... H01L 23/12; H01L 23/04; H01L 23/02
[52] U.S. Cl. ......................... 257/704; 257/698; 257/693; 257/678
[58] Field of Search ................................ 257/698, 704, 257/678, 684, 693

[56] References Cited

FOREIGN PATENT DOCUMENTS

| | | | |
|---|---|---|---|
| 58-176979 | 10/1983 | Japan | 257/704 |
| 59-17270 | 1/1984 | Japan | 257/704 |
| 62-37950 | 2/1987 | Japan | 257/704 |
| 62-108545 | 5/1987 | Japan | 257/704 |
| 63-293958 | 11/1988 | Japan | 257/704 |
| 1-57738 | 3/1989 | Japan | 257/704 |
| 1-161736 | 6/1989 | Japan | 257/704 |
| 3-105950 | 5/1991 | Japan | 257/704 |
| 3187247 | 8/1991 | Japan | . |
| 4-43671 | 2/1992 | Japan | 257/704 |
| 4-240751 | 8/1992 | Japan | 257/704 |
| 5-114662 | 5/1993 | Japan | 257/697 |

*Primary Examiner*—Mahshid Saadat
*Assistant Examiner*—Jhihan B. Clark
*Attorney, Agent, or Firm*—Sughrue, Mion, Zinn, Macpeak & Seas, PLLC

[57] ABSTRACT

A cap that functions as a heat sink is affixed to the obverse surface of a semiconductor chip having ball bumps attached to the wiring pads on its surface, following which the semiconductor chip with the affixed cap is mounted on the bottom surface of a depression in a case and the opening of the depression in the case is simultaneously sealed by the cap.

2 Claims, 4 Drawing Sheets

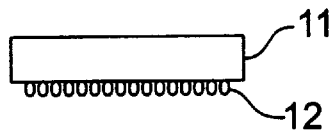
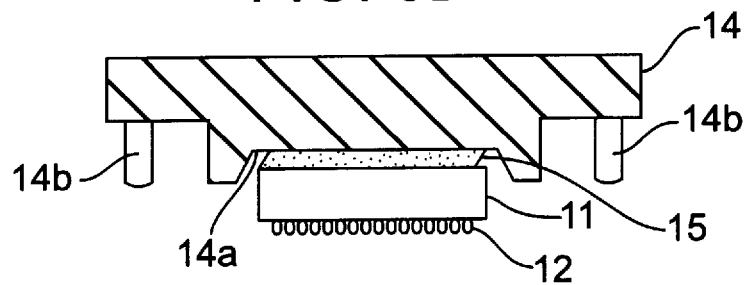
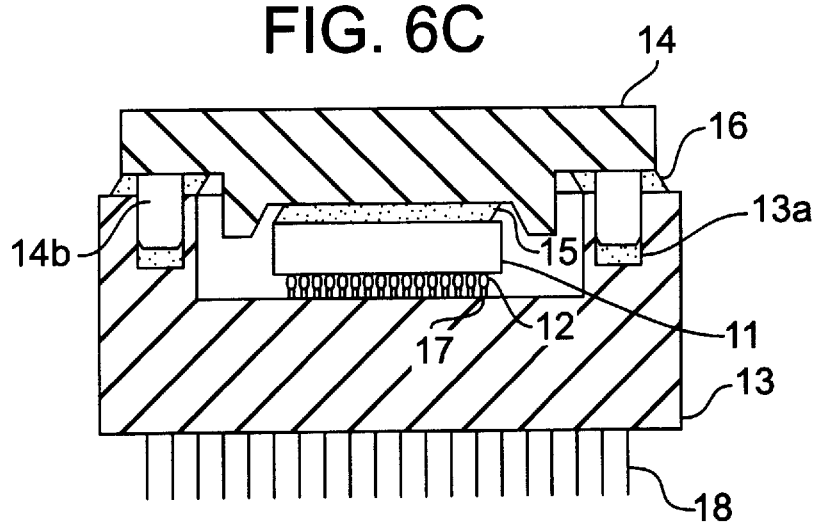

SEMICONDUCTOR PACKAGE AND METHOD OF MANUFACTURING THE SAME

BACKGROUND OF THE INVENTION

1. Field of the Invention

The present invention relates to a manufacturing method for a semiconductor package, and particularly to a manufacturing method for a semiconductor package for use in a flip chip.

2. Description of the Related Art

As shown in FIG. 1, a semiconductor package for use in a flip chip according to the prior art is made up of, for example, semiconductor chip 1 (also referred to as a "pellet"), case 3 having a depression which is a mounting portion for mounting semiconductor chip 1, and a cap 4 which seals the opening of the depression in case 3 and which further is affixed to semiconductor chip 1 and serves as a heat sink (heat discharge part). In addition, external terminal 8 for exchanging signals with semiconductor chip 1 is provided on the outer surface of case 3, and inner leads (internal wiring) 7 which are in electrical contact with external terminal 8 are arranged on the bottom surface of the depression of case 3.

In manufacturing such a semiconductor package, first, as shown in FIG. 2A, ball bumps 2 are attached to wiring connection terminals (also called "pads") (not shown in the figure) on the surface of semiconductor chip 1. Next, as shown in FIG. 2B, face bonding is effected between ball bumps 2 of semiconductor chip 1 and inner leads 7 on the bottom surface of the depression of case 3. Then, as shown in FIG. 2C, cap 4 is then bonded by means of resin 6 to semiconductor chip 1, which is mounted on case 3, and the opening of the depression of case 3 is sealed by cap 4 using resin 6.

However, in the manufacturing method of a semiconductor package of the prior art as shown in FIG. 2A–2C, when attaching cap 4, which also serves as a heat sink, after semiconductor chip 1 having attached ball bumps has already been mounted in case 3, the pressure at the time of sealing must be controlled both between cap 4 that doubles as a heat sink and the obverse surface of semiconductor chip 1 as well as between ball bumps 2 and inner leads 7 of case 3, and this control has been difficult. As a consequence, problems have occurred including incomplete sealing and cracking of semiconductor chips due to insufficient or excessive pressure at the time of sealing.

SUMMARY OF THE INVENTION

In view of the problems encountered in the prior art, the object of the present invention is to provide a manufacturing method for a semiconductor package for use in a flip chip in which pressure need only be controlled at one location when sealing a cap, thereby facilitating assembly.

To achieve the above-described object, a method of manufacturing a semiconductor package for use in a flip chip, comprising the steps of attaching conductive hemispherical projections to wiring connection terminals on the obverse surface of a semiconductor chip, affixing a cap having a heat sink function to the reverse surface of the semiconductor chip, placing the semiconductor chip affixed with the cap on the bottom surface of depression in a case, and sealing the gap between the case and the cap with resin.

Preferably, the above-described manufacturing method of a semiconductor package for use in a flip chip is characterized in that internal wirings formed on the bottom surface of the depression in the case and the projections of the semiconductor chip are positioned so as to come into contact when mounting the semiconductor chip on the bottom surface of the depression in the case.

Preferably, the above-described manufacturing method of a semiconductor package is further characterized in that a depression for accommodating the semiconductor chip is formed at a portion of the cap at which the semiconductor chip is affixed, holes are formed at the edge of the opening of the depression in the case, and projections are formed in the cap that mate with the holes in the case, and when the semiconductor chip is mounted on the bottom of the depression in the case, the projections of the semiconductor chip to which the cap is affixed are aligned with the internal wiring of the case as the projections of the cap are inserted into the holes in the case.

Preferably, the above-described manufacturing method of a semiconductor package is further characterized in that a depression for accommodating the semiconductor chip is formed in a portion of the cap at which the semiconductor chip is affixed, projections are formed in the edge of the opening of the depression in the case, and holes that mate with the projections of the case are provided in the cap, and when mounting the semiconductor chip on the bottom surface of the depression in the case, the projections of the semiconductor chip to which the cap is affixed are aligned with the internal wiring of the case as the projections of the case are inserted into the holes in the cap.

In the invention as described hereinabove, a semiconductor chip having conductive hemispherical projections attached to pads on its surface is affixed in advance to a cap that both seals the opening of the depression in a case and has a heat sink function; and the semiconductor chip with the affixed cap is then mounted on the bottom surface of the depression in a case; and as a result, when sealing with the cap, only the pressure between the projections attached to the semiconductor chip and the internal wiring of the case needs to be controlled, thereby enabling a simplification of the assembly. In this way, control of pressure is simplified when sealing with the cap, and problems can be avoided such as breakage of the semiconductor chip due to the application of excessive pressure when sealing or incomplete sealing of the cap due to insufficient pressure.

In addition, a depression for accommodating the semiconductor chip is formed in the portion of the cap at which the semiconductor chip is to be affixed, projections are formed in the edge of the opening of the depression in the case, and holes that mate with the projections in the case are provided in the cap; and as a result, when mounting the semiconductor chip on the bottom surface of the depression in the case, the projections attached to the semiconductor chip may be easily positioned with respect to the internal wiring of the case.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 6A–6C is an explanatory view of the manufacturing method for the semiconductor package according to the second embodiment of the present invention.

DETAILED DESCRIPTION OF THE PREFERRED EMBODIMENTS

First Embodiment

Similarly as in the prior art described above, this embodiment of the manufacturing method for the semiconductor package employs: semiconductor chip (also referred to as a "pellet") 1; case 3 having a depression which is a mounting portion for mounting semiconductor chip 1; and cap 4 that both seals the opening of the depression in case 3 and, being affixed to semiconductor chip 1, serves as a heat sink (heat discharge part).

Figure 1:
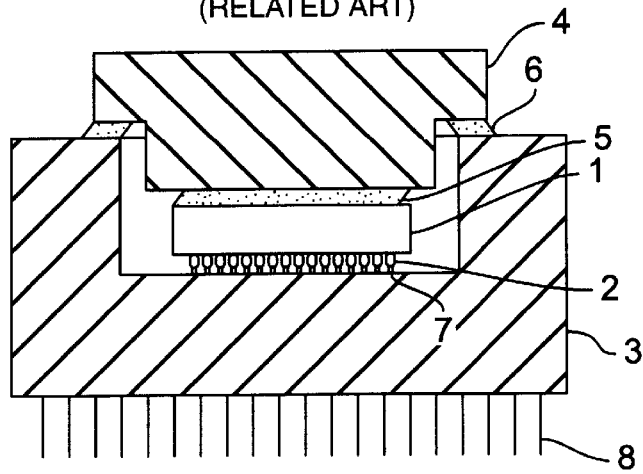
FIG. 1 is a longitudinal section view of a semiconductor package according to the prior art.
Figure 2A:
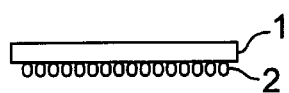
FIG. 2A–2C is an explanatory view of a manufacturing method for a semiconductor package according to the prior art.
Figure 2B:
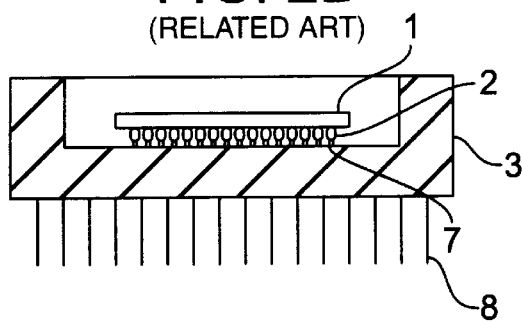
Figure 2C:
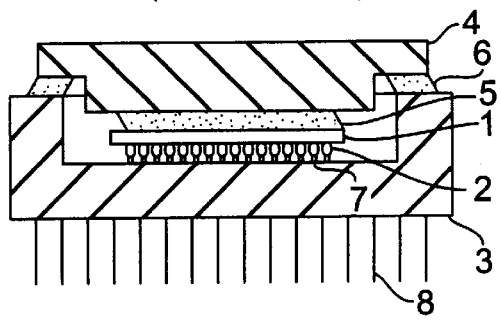
Figure 3A:
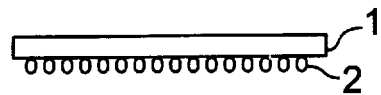
FIG. 3A–3C is an explanatory view of the manufacturing method for the semiconductor package according to the first embodiment of the present invention.
Figure 3B:
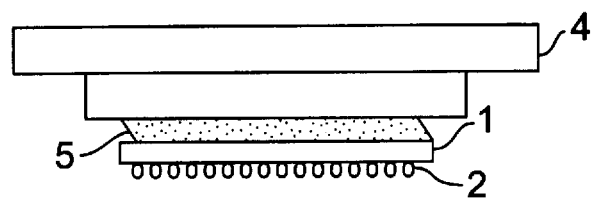
Figure 3C:
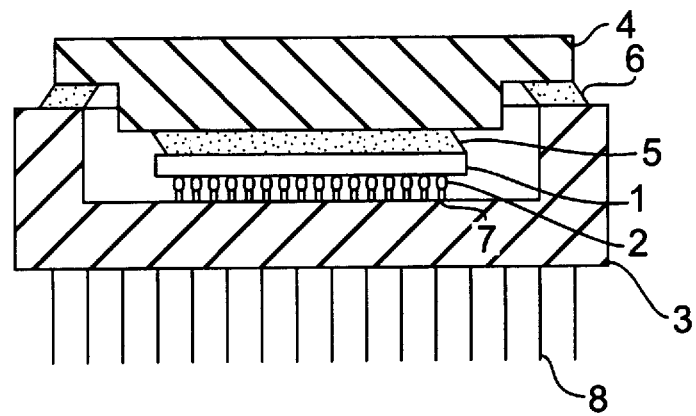

Regarding the assembly of these components, first, as shown in FIG. 3A, ball bumps 2, which are conductive hemispherical projections, are attached to wiring connection terminals (also called "pads") (not shown in the figure) on the obverse surface of semiconductor chip 1. And then, as shown in FIG. 3B, cap 4 is affixed to the reverse surface of semiconductor chip 1 using resin 5. Next, as shown in FIG. 3C, ball bumps 2 of semiconductor chip 1 to which cap 4 has been affixed are positioned with respect to inner leads 7 on the bottom surface of the depression in case 3 and face bonding effected, and the opening of the depression in case 3 is simultaneously sealed by cap 4 using resin 6.

By employing this type of manufacturing method, pressure need be controlled only between ball bumps 2 and inner leads 7 of case 3 when sealing by cap 4, and the assembly can therefore be simplified.

Second Embodiment

Figure 4:
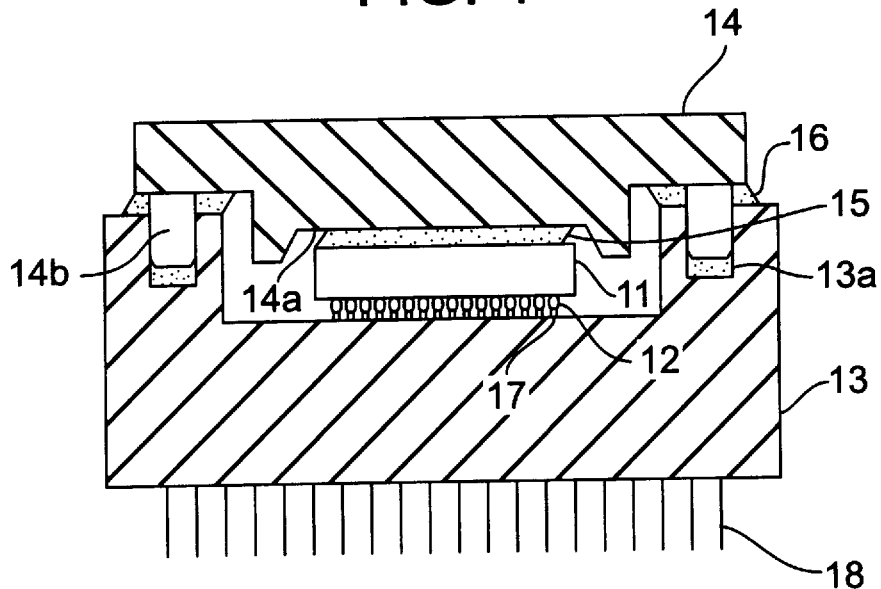
FIG. 4 is a longitudinal section view of a semiconductor package according to the second embodiment of the present invention.

As shown in FIG. 4, the manufacturing method for a semiconductor package according to this embodiment employs semiconductor chip 11 (also referred to as a "pellet"); case 13 which has a depression that is the mounting portion for mounting semiconductor chip 11; and cap 14 which both seals the opening of the depression in case 13 and serves as a heat sink (heat discharge part) affixed to semiconductor chip 11. External terminals 18 for exchanging signals with semiconductor chip 11 are provided on the outer surface of case 13, and inner leads (internal wiring) 17, which are in electrical contact with external terminals 18, are arranged on the bottom surface of the depression of case 13.

Figure 5:
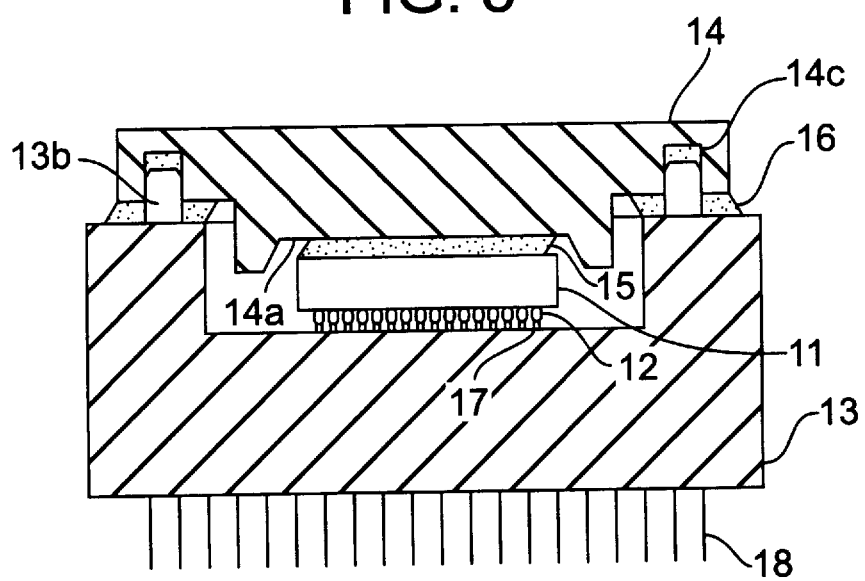
FIG. 5 is a longitudinal section view of a semiconductor package according to the alternative form of the second embodiment as shown in FIG. 4.

In this embodiment, a depression 14a for accommodating semiconductor chip 11 is additionally formed on cap 14 at the portion at which semiconductor chip 11 is affixed. In addition, holes 13a are formed at the edge of the opening of the depression in case 13, and projections 14a which mate with the holes in case 13 are provided on cap 14. Alternatively, as shown in FIG. 5, projections 13b may be provided on the case 13 side, and holes 14c that mate with the projections 13b may be provided on the cap 14 side.

Regarding the assembly of these components, first, ball bumps 12, which are conductive hemispherical projections, are attached to wiring connection terminals (also called "pads") (not shown in the figure) on the obverse-surface of semiconductor chip 11. And then, as shown in FIG. 6B, semiconductor chip 11 to which ball bumps 12 are attached is affixed on its reverse surface to depression 14a of cap 14 using resin 15. Next, as shown in FIG. 6C, ball bumps 12 of semiconductor chip 11, to which cap 14 has been affixed, are positioned with respect to inner leads 17 on the bottom surface of the depression in case 13 and face bonding effected while matching projections 14b of cap 14 with holes 13a of case 13, and the opening of the depression in case 13 is simultaneously sealed using resin 16.

In this embodiment, the positioning of ball bumps 12 and inner leads 17 can be easily achieved when mounting semiconductor chip 11 by first forming a depression 14a in cap 14 and determining the position at which semiconductor chip 11 is to be affixed, and moreover, by providing mutually matching projections 14b and holes 13a in cap 14 and case 13.

In addition, the projections of the cap or the case may be provided to become one with the cap or the case, or may be provided by separate parts.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor package comprising:

a case having a first depression;

internal wirings formed on a bottom surface of said first depression;

external terminals disposed on an outside of said case and electrically connected to said internal wirings;

a semiconductor chip accommodated in said first depression in said case;

a cap serving as a heat sink, said cap covering an opening formed by said first depression;

a second depression formed in said cap, said semiconductor chip being accommodated in said second depression;

holes formed in either said cap or said case at an edge of the opening formed by said first depression; and projections that mate with said holes, said projections being formed in an opposite one of said cap or said case at the edge of the opening formed by said first depression.

2. A method of manufacturing the semiconductor package recited in claim 1, said method comprising steps of:

attaching conductive hemispherical projections to wiring connection terminals on an obverse surface of said semiconductor chip;

affixing a reverse surface of said semiconductor chip to a bottom surface of said cap in said second depression;

placing said semiconductor chip affixed to said cap on the bottom surface of said first depression as said projections are inserted into said holes; and sealing a gap between said case and said cap with a resin.

* * * * *